United States Patent [19]

Heldenbrand et al.

[11] Patent Number: 4,679,867
[45] Date of Patent: Jul. 14, 1987

[54] CABINET FOR AN ELECTRONIC APPARATUS

[75] Inventors: Stanley W. Heldenbrand; Clyde L. Chappuis, both of San Jose, Calif.

[73] Assignee: Northern Telecom Limited, Montreal, Canada

[21] Appl. No.: 701,285

[22] Filed: Feb. 13, 1985

[51] Int. Cl.⁴ .............................................. A47B 81/00
[52] U.S. Cl. .................................... 312/287; 312/223; 312/257 R
[58] Field of Search ............ 312/283, 285, 233, 257 R, 312/257 SK, 223, 257 SM, 257 A, 287; 49/501

[56] References Cited

U.S. PATENT DOCUMENTS

| | | | |
|---|---|---|---|
| 2,774,808 | 12/1956 | Bullock | 312/285 X |
| 3,056,639 | 10/1962 | Caminker et al. | 312/257 SK X |
| 3,178,246 | 4/1965 | Riles | 312/257 SK |
| 3,192,306 | 6/1965 | Skonnord | 312/257 SK X |
| 3,240,862 | 3/1966 | Merkl et al. | 312/257 R X |
| 3,404,931 | 10/1968 | Fall et al. | 312/257 R |
| 3,925,710 | 12/1975 | Ebert | 312/223 X |
| 4,338,485 | 7/1982 | Fullenkamp et al. | 312/223 X |
| 4,344,256 | 8/1982 | King | 49/501 |
| 4,352,146 | 9/1982 | Hermanutz et al. | 312/223 X |
| 4,372,629 | 2/1983 | Propst et al. | 312/223 |
| 4,517,623 | 5/1985 | Barner et al. | 312/223 X |

FOREIGN PATENT DOCUMENTS 2804971 8/1979 Fed. Rep. of Germany ...... 312/296
853487 11/1960 United Kingdom ................ 312/285

*Primary Examiner*—Kenneth J. Dorner
*Assistant Examiner*—Thomas A. Rendos
*Attorney, Agent, or Firm*—Schwartz, Jeffery, Schwaab, Mack, Blumenthal & Evans

[57] ABSTRACT

A cabinet for an electronic apparatus which includes a shelf of removeable electronic circuit modules being interconnected by a back plane structure, the cabinet including side walls for supporting the shelf and a rear closure wall detachably fixed to rear edges of the side walls. Connector panels each diagonally straddle rear interior corners at junctions of the rear wall and the side walls to define vertical cable channels. An interconnect cavity behind the back plane structure is defined by a central portion of the rear wall between the connector panels and is limited by upper and lower closure panels at upper and lower ends of the connector panels. Edges of the upper and lower closure panels and the connector panels define a port for convenient physical access to the interconnect cavity when the rear wall is removed. Cable spans between the back plane structure and the connector panels are inherently direct and short, thereby minimizing potential EMI radiation such that feedthrough capacitance of connectors in the connector panel is likewise advantageously minimized.

5 Claims, 6 Drawing Figures

CABINET FOR AN ELECTRONIC APPARATUS

BACKGROUND OF THE INVENTION

It is only in the past decade that digital switching apparatus have become widely available in the form of central office and private branch exchanges. During this period, regulatory agencies in various countries have become concerned with such apparatus as a source of undesirable electromagnetic interference (EMI), particularly at frequencies of about 30 MHz, and higher. The trend toward higher control processor clock frequencies and more densely packaged circuitry has only exacerbated this problem. A typical approach to reducing the EMI radiated by such apparatus has been to encase the apparatus in a metal cabinet intended to function as an electromagnetic shield or container. However the multitude of telecommunciations lines and trunks which orginate within the apparatus and pass through openings in the shield tend to act as effective radiating antennas which substantially nullified the intended effect of the shield. It has since been observed that the amount of lead length of the lines and trunks inside the shield has a direct effect upon propagation of EMI. It was subsequently realized that capacitive feedthrough connectors fixed in the shield provide an input/output interconnect means which is effective in reducing EMI radiation to tolerable levels. For example in the case of tip and ring conductors of an analog telephone line being terminated in a typical DMS type telephone facility, a connector feedthrough capacitance of between 1000 and 15000 picofarads has been found to be quite helpful. However, in the case of a digital trunk being operated in the T1 standard format of about 1.5 MHz, a little more than 300 pf is tolerable before the form of the TDM binary signal bit stream carried by the trunk becomes unacceptably distorted. Consequently, digital trunks are each a greater contributor to the radiated EMI than are the analog lines. Fortunately, there are usually far fewer digital trunks than there are analog lines and the detrimental increase in EMI is small.

Recently, proposed switching machines are characterized by more tightly packaged electronic circuitry which operates at greater speeds. Furthermore, such machines provide among other features fully digitized twisted pair communication lines. Some of these communication lines are intended to operate at binary bit frequencies of up to almost 3 MHz. In such a machine the problem of meeting acceptable EMI limits is greatly magnified by the abundance of the digital signal twisted pair communication lines, and by the fact that from an operating viewpoint it is most preferable that the capacitance of the associated feedthrough connectors be substantially reduced.

SUMMARY OF THE INVENTION

It is an object of the invention to provide a housing or cabinet for electronic apparatus, such as a digital switching system, wherein cable channels and a conveniently accessible interconnect cavity are arranged to minimize EMI radiation from the apparatus during its normal operation.

It is also an object of the invention to provide a cabinet for an electronic apparatus, wherein an interconnect cavity is in part defined by a connector panel, which diagonally spans a rear interior corner of the cabinet to define a cable channel, such that lead spans between capacitive feedthrough input/output connectors, lodged in the connector panel and the back plane structure, are of minimal length.

In accordance with the invention, a cabinet is provided with an open face for accepting electronic circuit modules for containment therein. At the rear of the shelf, connector elements are carried in a back plane structure for interconnecting the electronic circuit modules. The cabinet comprises side walls having front and rear edges. The apparatus is supported between the side walls with the front face being near the front edges and the back plane structure being located intermediate the front and rear edges. A closure wall, having left and right edges, is detachably engaged with the rear edges of the side walls to provide a rear wall of the cabinet. The rear wall in combination with the rear edges of the side walls define left and right interior corners. A cable channel is defined along a portion of one of the interior corners by a portion of the rear wall, and a portion of the adjacent side wall in combination with a connector panel. The connector panel incudes a side edge being carried by the side wall along a line intermediate the plane of the back plane structure and the rear edge of the side wall, and includes a rear edge positioned next to the rearwall. An interconnect cavity is defined by upper and lower closure means, and surfaces of the rear wall, the side walls and the connector panel. The upper closure means spans an area defined by the upper end of the connector panel and bounded by the location for the back plane structure and portions of the rear and side walls. The lower closure means spans an area defined by the lower edge of the connector panel and is bounded by the location for the back plane structure and portions of the rear and side walls. At least those surfaces of the side and rear walls, the upper and lower closure means and the connector panel common to the interconnect cavity, are comprised of electrically conductive material, so that when assembled with the back plane structure, electromagnetic communication between the interconnect cavity and the cable channel is reduced.

In one example of the invention the cabinet is fabricated from metal sheet material and includes left and right connector panels which define left and right cable channels in the left and right rear interior corners of the cabinet. The closure wall may be provided by a door of a rigid honycomb panel structure which is hinged at the rear edge of one side wall and latches against the rear edge of the other side wall. An electromagnetic seal is provided between the door and the rear edges of the connector panels and rear edges of the upper and lower closure means by a hollow core conductive elastomeric gasket.

BRIEF DESCRIPTION OF THE DRAWINGS

An example embodiment is discussed with reference to the accompany drawings in which.

DETAILED DESCRIPTION

Figure 3:
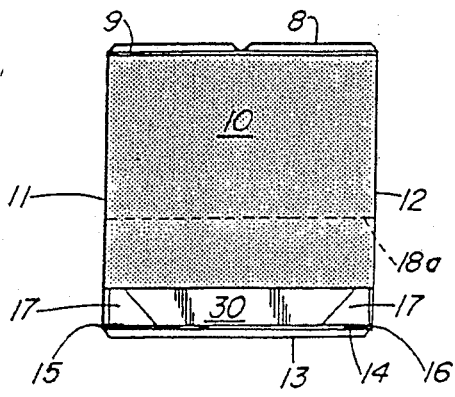
FIG. 3 is a top view of the cabinet in FIGS. 1 and 2.
Figure 1:
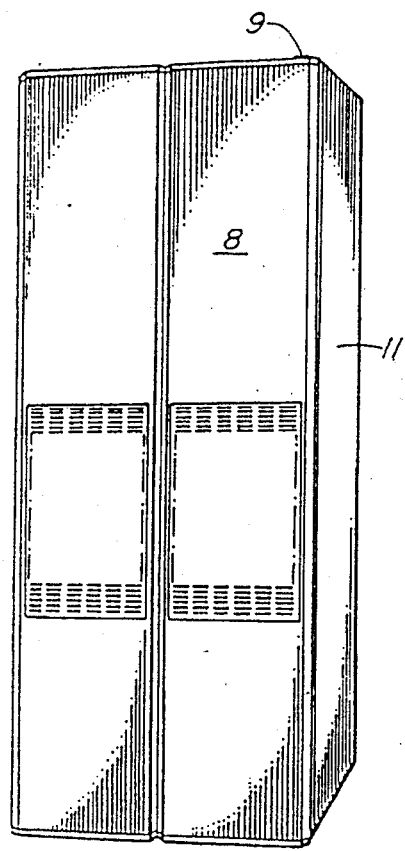
FIG. 1 is a perspective front view of a cabinet in accordance with the invention for housing electronic modules.
Figure 2:
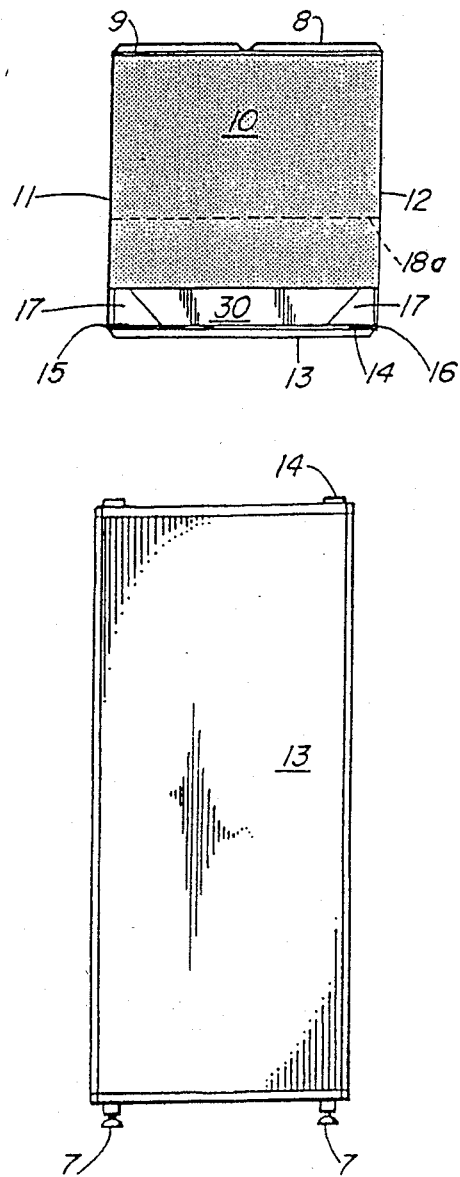
FIG. 2 is a rear view of the cabinet in FIG. 1.

Referring to FIGS. 1, 2 and 3, the cabinet includes front and rear doors 8 and 13 and left and right side walls 11 and 12 being supported by feet 7 as shown. Latch operating buttons 9 and 14 are located in upper edges of the front and rear doors 8 and 13 respectively. The top of the cabinet is partially closed by a perforated panel 10. The bottom of the cabinet, not shown, is likewise partially closed in a similar manner. Equipment shelves (not shown) for housing electronic circuit modules (not shown) being removably retained therein, are carried one above another between the left and right side walls 11 and 12. In FIG. 3 a broken line indicated at 18a illustrates a typical location of a back plane structure of the shelves which serves to connect energizing power to the circuit modules and to interconnect logic and communication signals between the circuit modules. Vertical cable channels 17 are defined at the rear edges 15 and 16 of the side walls 11 and 12 as shown in FIG. 3. Also visible is a top closure panel 30 of an interconnect cavity which is discussed in more detail with reference to FIGS. 4, 5 and 6.

Figure 4:
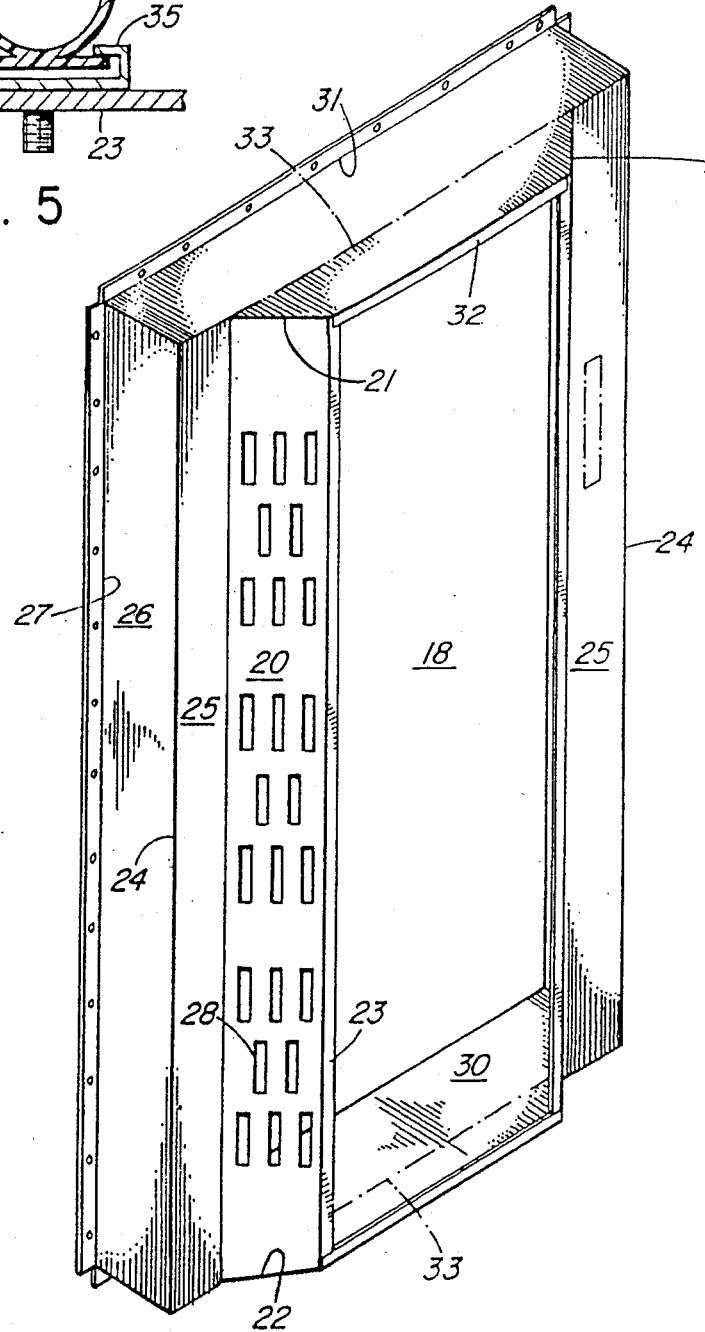
FIG. 4 is a rear perspective view of one example of an interconnect shroud useful in the cabinet shown in FIGS. 1, 2 and 3.

The interconnect cavity shroud illustrated in FIG. 4 includes left and right diagonally oriented connector panels 20 each having upper and lower edges 21 and 22 and a rear edge 23. The connector panels 20 each project from respective walls 25 which are joined at corners 24 to respective cavity side walls 26. Each of the cavity side walls 26 extends to a joining strip 27. The upper and lower edges 21 and 22 are bounded by upper and lower closure panels, which provide a floor and a ceiling for the interconnect cavity. Each are identified by the numeral 30. Each of the closure panels 30 includes a rear edge 32 and a joining strip 31, as shown. The joining strips 27 and 31 form a rectangular periphery which is adapted for joining to a back plane structure. Elongated apertures 28 defined in the connector panels 20 are intended for mounting of feedthrough capacitive connectors. Not all of the apertures 28 need be occupied if care is taken with the dimensions of the apertures such that they are small enough to arrest propagation of EMI at frequencies of concern. However if this is inconvenient the unused ones of the apertures 28 may be closed by frictionally retained metal plugs (not shown).

The rear edges 23 and 32 define a rectangular periphery of an access port which permits physcial access to the interior of the interconnect cavity shroud and a back plane area indicated at 18. The rear edges 23 and 32 normally carry a gasket structure, similar to that illustrated in FIG. 5. The gasket structure includes a retaining channel 35 which retains a base 36 of a gasket 37 having a hollow or vacant core indicated at 38. The gasket is preferably an electrically conductive elastomeric material which forms an electromagnetic radiation resistant seal with the inner surface of the rear door 13, when it is in a closed position. In the closed position, the rear door 13 also completes an enclosure of the cable channels 17.

Figure 6:
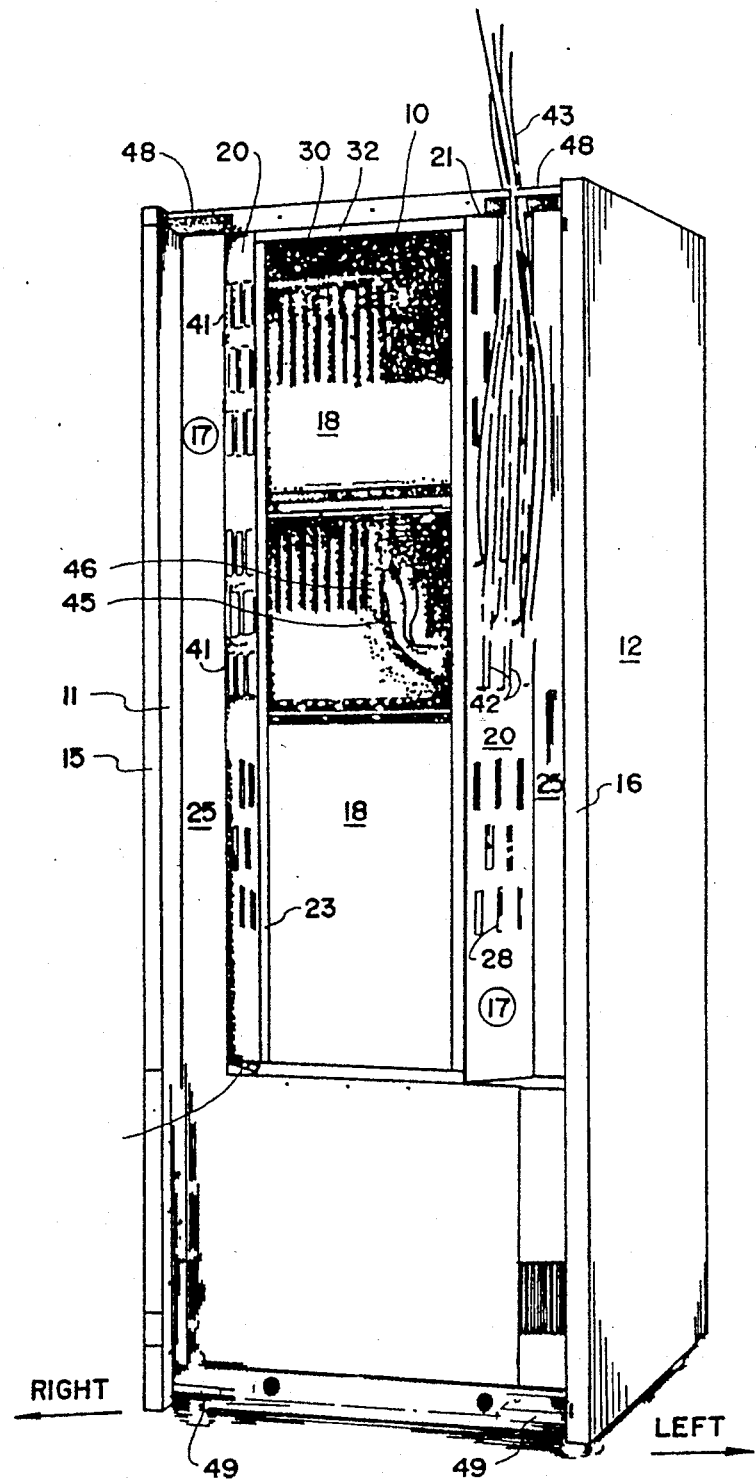
FIG. 6 is a rear view of the cabinet illustrated in the preceding figures having its rear door removed for illustration of an interconnect shroud and cable channels therein, in accordance with the invention.

In a variation of the interconnect cavity, the walls 25 instead of terminating at the corners 24 are joined with the respective left and right side walls of the cabinet, as exemplified in the embodiment illustrated in FIG. 6. Also the upper and lower closure panels are of reduced size, terminating along unevenly broken lines 33, in FIG. 4.

Figure 5:
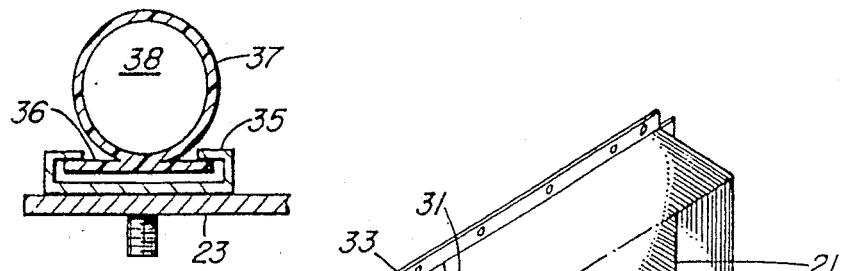
FIG. 5 is a cross-sectional view of a gasket for reducing EMI radiation, taken along a line AA in FIG. 4.

Referring to FIG. 6, the cabinet is shown with the rear door or closure wall 13 removed for ease of illustration. A back plane structure is partially illustrated in an area 18. The back plane structure is associated with a plurality of equipment shelves in which electronic modules are normally retained. The back plane structure provides for interconnection between various of the modules and for input/output connection via connectors 46 and input/output ribbon cables 45, only a few of which are shown for the purpose of illustration. The exemplified cabinet internal structure is particularly advantageous for housing telecommunication electronic apparatus of the digital signal nature. As the distance spanned by the input/output ribbon cables 45 is optimally short, in operation pick-up of EMI by the cables in the interconnect cavity is significantly minimized. Each of the ribbon cables 45 terminates at one of female connectors 41 which are intended for connection to multipair cables 43 residing in the cable channels 17 via connectors 42. Each of the cable channels 17, in this example, are intended to enclose the cables 43 which may leave the top of the cabinet via either of cable retaining loops 48 or may leave the bottom of the cabinet via either of cable retaining loops 49. When the rear door is in the closed position a metallic inside surface of the door lies close to the edges 23 and 32, with the gasket 37 as shown in FIG. 5, being compressed therebetween. Thus it is not necessary to have a close fit with the rear door 13 and the right and left rear edges 15 and 16. When the rear door 13 is in a widely open position, the interconnect cavity is readily accessible, in the area of the back plane structure. Due to the diagonal-like orientation of the connector panels, the inner sides of these panels are likewise conveniently available for configuring and/or reconfiguring interconnections with the ribbon cables 45. As the connector panels are rigidly fixed in place as opposed to a hinged alternative arrangement, disturbance of the ribbon cables 45 is advantageously minimized during addition or reconfiguration thus minimizing the likelihood of fatigue of the metallic conductors therein during the useful lifetime of the electronic apparatus.

In operation of digital telecommunication equipment housed as described above it has been found that tolerable EMI radiation levels are achieved with feedthrough connection capacitances being limited to no more than about 150 pf.

What is claimed is:

1. A cabinet having an open front face for accepting electronic circuit modeules for containment therein and back plane connector elements carried by a back plane structure for interconnecting the electronic circuit modules, the cabinet comprising:
    side walls having front and rear edges, and said back plane structure being in a plane normal to said side walls intermediate said front and rear edges;
    a closure wall having left and right edges being detachably engaged with the said edges of said side walls to provide a rear wall of the cabinet, said rear wall defining left and right interior corners, respectively, with said side walls;
    a cable channel being defined along a portion of one of the interior corners by a connector panel in combination with a portion of said rear wall, and by an adjacent portion of one of said side walls, said connector panel having a rear edge positioned next to said rear wall and a side edge being carried by said one of said side walls along a line intermediate the plane of said back plane structure and the rear edge of said one of said side walls; and an interconnect cavity being defined by:

upper closure means spanning an area being defined by an upper end of said connector panel and bounded by said plane of said back plane structure and portions of said rear and side walls, other than those portions common to the cable channel, and lower closure means spanning an area being defined by a lower end of said connector panel and bounded by said plane of said back plane structure and portions of said rear wall and said side walls other than those portions common to said cable channel;

wherein at least those surfaces of said side and rear walls, said upper and lower closure means and said connector panel common to said interconnect cavity are comprised of electrically conductive material;

whereby electromagnetic interference between said interconnect cavity and said cable channel is reduced.

2. A cabinet as defined in claim 1 further comprising:
a gasket means interposed between said rear wall and said rear edge of said connector panel for forming an electromagnetic radiation seal whereby electromagnetic interference between said interconnect cavity and said cable channel is further reduced.

3. The cabinet of claim 2 wherein said gasket means is comprised of an electrically conductive elastomeric material and has a hollow core.

4. A cabinet for housing a telecommunication apparatus, the cabinet including left and right side walls and front and rear doors for permitting physical access to the apparatus, the apparatus including a back plane structure within the cabinet, said back plane structure being positionable in a plane normal to said side walls and intermediate said front and rear doors, the cabinet being characterized by:

left and right cable channels being defined at left and right interior corners of the cabinet by said rear door when in a closed position, said left and right side walls, respectively, and a left connector panel being angled diagonally between said left side wall and said rear door, and a right connector panel being angled diagonally between said right side wall and said rear door;

an interconnect cavity being defined by a floor member spanning an area bounded by an plane of said back plane structure, lower edges of said right and left connector panels and said rear door when in a closed position, and a ceiling member spanning an area bounded by a plane of said back plane structure, upper edges of said connector panels and said rear door when in the closed position;

wherein, when said rear door is in an open position, a periphery of a port is defined by the rearmost edges of said floor, said ceiling, and said left and right connector panels, said port being for physical access to an interior of said interconnect cavity and said back plane structure.

5. The cabinet of claim 4, wherein at least those surfaces of said side walls and rear door, said ceiling and floor members, and said right and left connector panels common to said interconnect cavity are comprised of electrically conductive material.

* * * * *